(12) United States Patent
Zheng et al.

(10) Patent No.: US 10,403,767 B2
(45) Date of Patent: Sep. 3, 2019

(54) HIGH CONTRAST FAR-FIELD RADIATIVE THERMAL DIODE

(71) Applicant: Rhode Island Council on Postsecondary Education, Providence, RI (US)

(72) Inventors: Yi Zheng, Kingston, RI (US); Alok Ghanekar, Kingston, RI (US); Gang Xiao, Barrington, RI (US)

(73) Assignee: Rhode Island Council on Postsecondary Education, Providence, RI (US)

( * ) Notice: Subject to any disclaimer, the term of this patent is extended or adjusted under 35 U.S.C. 154(b) by 0 days.

(21) Appl. No.: 16/039,324

(22) Filed: Jul. 18, 2018

(65) Prior Publication Data

US 2019/0027615 A1    Jan. 24, 2019

Related U.S. Application Data

(60) Provisional application No. 62/535,936, filed on Jul. 23, 2017.

(51) Int. Cl.
| | |
|---|---|
| *H01L 29/861* | (2006.01) |
| *H01L 35/04* | (2006.01) |
| *F28D 15/02* | (2006.01) |
| *H01L 35/00* | (2006.01) |

(52) U.S. Cl.
CPC ........ *H01L 29/861* (2013.01); *F28D 15/0233* (2013.01); *H01L 35/00* (2013.01); *H01L 35/04* (2013.01)

(58) Field of Classification Search
CPC ....... H01L 29/861; H01L 35/00; H01L 35/04; F28D 15/0233; G01K 7/01
USPC ......................................................... 257/467
See application file for complete search history.

(56) References Cited

U.S. PATENT DOCUMENTS 9,658,109 B2 * 5/2017 Geiger .................... G01J 5/046

OTHER PUBLICATIONS

Kats, M.A., and Capasso, F., "Optical absorbers based on strong interference in ultra-thin films," Laser & Photonics Reviews, 10, 699-699 (2016).

(Continued)

*Primary Examiner* — Tu-Tu V Ho
(74) *Attorney, Agent, or Firm* — Barlow, Josephs & Holmes, Ltd.

(57) ABSTRACT

A far-field radiative thermal rectification device uses a phase change material to achieve a high degree of asymmetry in radiative heat transfer. The device has a multilayer structure on one side and a blackbody on other side. The multilayer structure can consist of a transparent thin film of KBr sandwiched between a thin film of $VO_2$ and a reflecting layer of gold. When $VO_2$ is in its insulating phase, the structure is highly reflective due to the two transparent layers on highly reflective gold. When $VO_2$ is in the metallic phase, Fabry-Perot type of resonance occurs and the tri-layer structure acts like a wide-angle antireflection coating achieved by destructive interference of partially reflected waves making it highly absorptive for majority of spectral range of thermal radiation. The instant structure can form the active part of a configuration that acts like a far-field radiative thermal diode.

18 Claims, 7 Drawing Sheets

(56) References Cited

OTHER PUBLICATIONS

Narayanaswamy, A., and Zheng, Y., "A Green's function formalism of energy and momentum transfer in fluctuational electrodynamics," Journal of Quantitative Spectroscopy & Radiative Transfer, Elsevier Ltd., 132 12-21 (2014).
Barker, A.S., Verleur, H.W., and Guggenheim, H.J., "Infrared Optical Properties of Vanadium Dioxide above and below the transition temperature," Physical Review Letters, 17, 1286 (1966).
Li, H.H., "Refractive Index of Alkali Halides and Its Wavelength and Temperature Derivatives," Journal of Physical and Chemical Reference Data, 5, No. 2, 329-528 (1976).
Johnson, P.B. and Christy, R.W., "Optical Constants of the Noble Metals," Physical Review B, vol. 6, No. 12, 4370, Dec. 15, 1972.
Li, B., Wang, L. and Casati, G., "Thermal Diode: Rectification of Heat Flux," Physical Review Letters, 2004 The American Physical Society, vol. 93, No. 18, 184301 (2004).
Li, B., Wang, L. and Casati, G., "Negative differential thermal resistance and thermal transistor," Applied Physics Letter, 88, 143501 (2006).
Wang, L and Li, B., "Thermal Memory: A Storage of Phononic Information," Physical Review Letters, 2008 The American Physical Society, PRL 101, 267203 (2008).
Kobayashi, W., Teraoka, Y., and Terasaki, I., "An oxide thermal rectifier," Applied Physics Letters, 95 171905 (2009).
Sawaki, D., Kobayashi, W., Moritomo, Y., and Terasaki, I., "Thermal rectification in bulk materials with asymmetric shape," Applied Physics Letters, American Institute of Physics, 98, 081815 (2011).
Kobayashi, W., Sawaki, D., Omura, T., Katsufuji, T., Moritomo, Y., and Terasaki, I., "Thermal Rectification in the Vicinity of a Structural Phase Transition," Applied Physics Express, The Japan Society of Applied Physics, 5, 027302 (2012).
Chang, C. W., Okawa, D., Majumdar, A. and Zettl, A., "Solid-State Thermal Rectifier," Science vol. 314 1121-1124 (2006).
Martinez-Perez, M., Fornieri, A., and Giazotto, F., "Rectification of electronic heat current by a hybrid thermal diode," Nature nanotechnology 10 303-307 (2015).
Ben-Abdallah, P. and Biehs, S., "Near-Field Thermal Transistor," Physical Review Letters, American Physical Society, PRL 112, 044301 (2014).
Ben-Abdallah, P. and Biehs, S., "Phase-change radiative thermal diode," Applied Physics Letters, AIP Publishing LLC, 103, 191907 (2013).
Otey, C.R., Lau, W.T., and Fan, S., "Thermal Rectification through Vacuum," Physical Review Letters, The American Physical Society, PRL 104, 154301 (2010).
Wang, L. and Li, B., "Phononics gets hot", Physics World, 21, 27-29 (2008).
Wang, L. and Li, B., "Thermal Logic Gates: Computation with Phonons," Physical Review Letters, The American Physical Society, PRL 99, 177208 (2007).
Ben-Abdallah, P. and Biehs, S. A., "Towards Boolean operations with thermal photons," Physical Review, American Physical Society, B 94, 241401(R) (2016).
Li, N., Ren, J., Wang, L., Zhang, G., Hanggi, P., and Li, B., "Colliquium: Phononics: Maniplating heat flow with electronic analogs and beyond," Reviews of Modern Physics, American Physical Society, vol. 84, Jul.-Sep. 2012.
Song, B., Fiorino, A., Meyhofer, E., and Reddy, P., "Near-field radiative thermal transport: From theory to experiment," AIP Advances 5, 053503 (2015).
Yang, Y., Basu, S., and Wang, L., "Radiation-based near-field thermal rectification with phase transition materials," Applied Physics Lettes, AIP Publishing LLC, 103, 163101 (2013).
Huang, J., Li, Q., Zheng, Z., and Xuan, Y., "Thermal rectification based on thermochromic materials," International Journal of Heat and Mass Transfer, Elsevier, 67, 575-580, (2013).

Niefzaoui, E., Joulain, K., Drevillon, J., and Ezzahri, Y., "Radiative thermal rectification using superconducting materials," Applied Physics Letters, AIP Publishing LLC, 104, 103905 (2014).
Joulain, K., Ezzahri, Y., Drevillon, J., and Ben-Abdallah, P., "Modulation and amplification of radiative far field heat transfer: Towards a simple radiative thermal transistor," Applied Physics Letters, AIP Publishing LLC, 106, 133505 (2015).
Van Zwol, P. J., Joulain, K., Ben-Abdallah, P., Greffet, J. J., and Chvrier, J., "Fast nanoscale heat-flux modulation with phase-change materials," Physical Review, American Physical Society, B 83, 20140(R) (2011).
Van Zwol, P. J., Ranno, L., and Chevrier, J., "Tuning Near Field Radiative Heat Flux through Surface Excitations with a Metal Insulator Transition," Physical Review Letters, American Physical Society, PRL 108, 234301 (2012).
Menges, F., Dittberner, M., Novotny, L., Passarello, D., Parkin, S.S.P., Spieser, M., Riel, H. and Gotsmann, B., "Thermal radiative near field transport between vanadium dioxide and silicon oxide across the metal insulator transition," Applied Physics Letters, AIP Publishing, 108, 171904 (2016).
Ghanekar, A., Ji, J., and Zheng, Y., "High-rectification near-field thermal diode using phase change periodic nanosructure," Applied Physics Letter, AIP Publishing, 109, 123106 (2016).
Yang, Y., Basu, S., and Wang, L., "Vacuum thermal switch made of phase transition materials considering thin film and substrate effects," Journal of Quantitative Spectroscopy & Radiative Transfer, Elsevier, 158 69-77 (2015).
Prodhomme, H., Ordonez-Miranda, J., Ezzahri, Y., Drevillon, J., and Joulain, K., "Optimized thermal amplification in a radiative transistor," Journal of Applied Physics, AIP Publishing, 119, 194502 (2016).
Zhu, L., Otey, C.R., and Fan, S., "Negative differential thermal conductance through vacuum," Applied Physics Letters, American Institute of Physics, 100, 044104 (2012).
Lee, K.T., Ji, C., and Jay Guo, L., "Wide-angle, polarization-independent ultrathin broadband visible absorbers," Applied Physics Letters, AIP Publishing LLC, 108, 031107 (2016).
Zheng, Y. and Ghanekar, A., "Radiative energy and momentum transfer for various spherical shapes: a single sphere, a bubble, a spherical shell and a coated sphere," Journal of Applied Physics, 117, 064314 (2015).
Zhu, L., Otey, C.R., and Fan, S., "Ultrahigh-contrast and large-bandwith thermal rectification in near-field electromagnetic thermal transfer between nanoparticles," Physical Review, American Physical Society, B 88, 184301 (2013).
Ghanekar, A., Lin, L., Su, J., Sun, H. and Zheng, Y., "Role of nanoparticles in wavelength selectivity of multilayered structures in the far-field and near-field regimes," Optics Express 23, A1129-A1139 (2015).
Ghanekar, A., Lin, L. and Zheng, Y., "Novel and efficient Mie-metamaterial thermal emitter for thermophotovoltaic systems," Optics Express 24 A858-A877 (2016).
Rinnerbauer, V., Lenert, A., Bierman, D.M., Yeng, Y. X., Chan, W.R., Geil, R. D., Senkevich, J. J., Joannapoulos, J. D., Wang, E. N., Soljacic, M., and Celanovic, I., "Metallic Photonic Crystal Absorber-Emitter for Efficient Spectral Control in High-Temperature Solar Thermophotovoltaics," Advanced Energy Materials 4 (2014).
Chou, J. B., Yeng, Y. X., Lenert, A., Rinnerbauer, V., Celanovic, I., Soljacic, M., Wang, E N., and Kim, S.G., "Design of wide-angle selective absorbers/emitters with dielectric filled metallic photonic crystals for energy applications," Optics Express 22, A144-A154 (2014).
Biehs, S.A., Rosa, F.S.S., and Ben-Abdallah, P., "Modulation of near-field heat transfer between two gratings," Applied Physics Letters, American Institute of Physics, 98, 243102 (2011).
Zheludev, N.I. and Kivshar, Y.S., "From metamaterials to metadevices," Nature Materials, Macmillan Publishers Limited, vol. 11, Nov. 2012.
Yu, N. and Capasso, F., "Flat optics with designer metasurfaces," Nature Materials, Macmillan Publishers Limited, vol. 13, Feb. 2014.

(56) References Cited

OTHER PUBLICATIONS

Unlu, M.S. and Strite, S., "Resonant cavity enhanced photonic devices," Journal of Applied Physics, American Institute of Physics, 78(2), 607-639, Jul. 15, 1995.

Kishino, K., Unlu, M.S., Chyi, J.I., Arsenault, R.L., and Morkoc, H., "Resonant Cavity-Enhanced (RCE) Photodetectors,", IEEE Journal of Quantum Electronics, vol. 27, No. 8, 2025-2034 Aug. 1991.

Fante, R.L. and McCormack, M.T., "Reflection Properties of the Salisbury Screen," IEEE Transactions on Antennas and Propagation, vol. 36, No. 10, 1443-1454 (1988).

Ra'di, Y., Simovski, C.R., and Tretyakov, S.A., "Thin Perfect Absorbers for Electromagnetic Waves: Theory, Design, and Realizations," Physical Review Applied, American Physical Society, 3 037001 (2015).

Bosman, H., Lau, Y.Y., and Gilgenback, R.M., "Microwave absorption on a thin film," Applied Physics Letters, American Institute of Physics, vol. 82, No. 9 1353-1355, (2003).

Hagglund,C., Apell, S.P., and Kasemo, B., "Maximized Optical Absorption in Ultrathin Films and Its Application to Plasmon-Based Two-Dimensional Photovoltaics," Nano Letters, American Chemical Society, 10 3135-3121 (2010).

Pu, M., Feng, Q., Wang, M., Hu, C., Huang, C., Ma, X., Zhao, Z., Wang, C., and Luo, X., "Ultrathin broadband nearly perfect absorber with symmetrical coherent illumination," Optics Express 20, 2246-2254 (2012).

Nefzaoui, E., Drevillon, J., Ezzahri, Y., and Joulain, K., Simple far-field radiative thermal rectifier using Fabry-Perot cavities based infrared selective emitters, Applied Optics, Optical Society of America, vol. 53, No. 16 3479-3485 (2014).

Kats, M.A., Sharma, D., Lin, J., Genevet, P., Blanchard, R., Yang, Z., Qazilbash, M.M., Basov, D.N., Ramanathan, S., and Capasso, F., "Ultra-thin absorber employing a tunable phase change material," Applied Physics Letters, American Institute of Physics, 101, 221101 (2012).

Taylor, S., Yang, Y., and Wang, L., "Vanadium dioxide based Fabry-Perot emitter for dynamic radiative cooling applications," Journal of Quantitative Spectroscopy & Radiative Transfer, Elsevier Ltd., 197 76-83, (2017).

Qazibash, M.M., Brehm, M., Andreev, G.O., Frenzel, A., Ho, P.C., Chae, B.-G., Kim, B-J., Yun, S.J., Kim, H.-T., Balatsky, A.V., Shpyrko, O.G., Maple, Keilmann, F., and Basov, D.N., Infrared spectroscopy and nano-imaging of the insulator-to-metal transition in vanadium dioxide, Physical Review, The America Physical Society, 3 79, 075107 (2009).

Frenzel, A., Qazilbash, M.M., Brehm, M., Chae, B.G., Kim, B.J., Kim, H.T., Balatsky, A.V., Keilmann, F., and Basov, D.N., "Inhomogeneous electronic state near the insulator-to-metal transition in the correlated oxide VO2," Physical Review, American Physical Society, B 80, 115115 (2009).

Ordonez-Miranda, J., Ezzahri, Y., Drevillon, J., and Joulain, K., "Transistorlike Device for Heating and Cooling Based on the Thermal Hysteresis of VO2," Physical Review Applied, American Physical Society, 6, 054003 (2016).

* cited by examiner

HIGH CONTRAST FAR-FIELD RADIATIVE THERMAL DIODE

CROSS-REFERENCE TO RELATED APPLICATIONS

This application is related to and claims benefit of U.S. Provisional Application No. 62/535,936 filed Jul. 23, 2017, the entire contents of which are incorporated by reference.

STATEMENT OF GOVERNMENT INTEREST

This invention was made with government support under Grant #P20 GM103430 awarded by the National Institute of Health. The government has certain rights in the invention.

BACKGROUND OF THE DISCLOSURE

Thermal diodes, thermal transistors, thermal memory element and similar thermal analogues of electronic devices have been topic of theoretical, as well as experimental, works. While earlier research has been on conduction (phonon) based devices, more recent studies have been focusing on radiation (photon) based thermal rectifiers. Thermal rectification has numerous applications in thermal management, thermal logic gates and information processing.

Analogous to electrical diodes, thermal diodes are rectification devices where the magnitude of heat flux strongly depends on the sign of applied temperature bias. To quantify rectification, we employ the widely used definition of rectification ratio, i.e., $R=(Q_f-Q_r)/Q_r$ where $Q_f$ and $Q_r$ refer to forward and reverse heat flux, respectively. Alternatively, rectification coefficient can be defined as $\eta=(Q_f-Q_{96})/\max(Q_{96},Q_f)$. There are numerous studies pertaining to near-field and far-field thermal radiation based rectification devices that exploit temperature dependent properties of a phase change materials such as vanadium dioxide ($VO_2$) and $La_{0.7}Ca_{0.15}Sr_{0.15}MnO_3$ (LCSMO). A number of studies deal with far-field thermal radiation while several others focus on modulation of radiative heat transfer in the near-field regime. Ben-Abdallah and Biehs introduced a $VO_2$ based simple far-field radiative thermal diode, while Prod'homme, et al., proposed a far-field thermal transistor that uses a $VO_2$ base between a blackbody collector and a blackbody emitter. Zhu, et al., showed that temperature dependent optical properties of SiC can be used to attain negative differential conductance. Van Zwol, et al., proposed that one can take advantage of the phase transition from crystalline to amorphous state in AIST (an alloy of Ag, In, Sb, and Te) driven by a current pulse to obtain a large contrast in heat flux. In far-field limit, rectification is due to the change in emissive properties of a phase change material. In near-field limit, the difference in the coupling strength of polaritons or tunneling of surface waves between structures leads to thermal rectification. In general, it is observed that a higher rectification can be achieved in the near-field regime than in the far-field. However, it challenges persisted in developing such devices that can operate on the principle of near-field radiative transfer.

Spectral control has been studied to affect radiative heat transfer in both the far-field as well as near-field. Customization of absorption/emission spectra is often achieved by the use of multilayer thin film structures, nanoparticles, dielectric mixtures, photonic crystals, 1-D/2-D gratings and metamaterials. Absorbers that utilize Fabry-Perot cavities, Salibury screens and Jaumann absorbers and ultra-thin lossy thin films bounded by transparent substrate and superstate have been investigated for decades. Quite notably, Nefzaoui, et al., proposed using multilayer structures consisting of thin films (e.g., Si, HDSi and gold) to obtain thermal rectification. Kats, el al., have theoretically and experimentally demonstrated that a thin-film of $VO_2$ on sapphire shows strong modulation of absorbance upon phase transition, particularly, at wavelength of 11.6 μm. Taylor, et al., recently proposed an emitter consisting a dielectric spacer between $VO_2$ film and a reflecting substrate to achieve dynamic radiative cooling upon phase transition of $VO_2$. Fabry-Perot resonance was achieved at 10 μm wavelength. As discussed later, we show that, by tuning the resonance at right wavelength, maximum rectification can be achieved in the proposed design.

$VO_2$ has often been used in thermal rectification devices, because its phase-change from an insulator to a metal can be switched reversibly within a short time (~100 fs). The common devices use either a bulk $VO_2$ solid or its thin-film form. However, a need persists for devices which employ a $VO_2$ based far-field thermal rectification device with a simple multilayer structure with a record rectification factor of greater than 11($\eta$>0.91).

SUMMARY OF THE INVENTION

A thermal diode is disclosed having a vertical structure with active and passive components. The active component of the thermal diode can contain a tri-layer structure consisting of $VO_2$, potassium bromide (KBr) and gold thin films disposed on a substrate. The thicknesses of $VO_2$ and KBr layers can be tuned to maximize rectification of the resulting device. The thickness of gold layer can be fixed at 1 μm to block radiation from the substrate. For a given temperature bias, a maximum (far-field) radiative heat transfer would be possible when both sides are blackbodies, while minimum heat transfer would take place when at least one side is a highly reflective mirror. In one embodiment, the active component can exhibit a transition from blackbody to reflective surface upon the reversal of a temperature bias which can induce the phase change. As such, the passive component is chosen to be a blackbody. Structure 1 and 2, the passive and active components respectively, are at temperature $T_1=T_C+\Delta T$ and $T_2=T_C-\Delta T$, respectively. The mean temperature can be chosen to be the phase transition temperature of $VO_2(T_C=341$ K). When $T_1>T_2$ (referred to as forward bias), $VO_2$ layer is in its metallic phase; and when $T_1<T_2$ (reverse bias), $VO_2$ layer becomes insulating with its optical axis aligned along the vertical direction, i.e., z-axis.

The phase transition of $VO_2$ is not abrupt and a complete insulator-metal transition does not occur until 350 K. The rectification ratio depends on temperature bias as the temperature dependence of radiative heat transfer is essentially nonlinear. The rectification values are calculated at a minimal temperature bias of 20 K i.e., $\Delta T=\pm 10$ K. Although transition of $VO_2$ exhibits a thermal hysteresis of about 8 K, the phase transition is reversible. If the heat flux values are at 10 K, above and below the critical temperature of $VO_2$, the hysteresis behavior is beyond the scope of this disclosure.

BRIEF DESCRIPTION OF THE DRAWINGS

While the specification concludes with claims particularly pointing out and distinctly claiming particular embodiments of the instant invention, various embodiments of the invention can be more readily understood and appreciated from the following descriptions of various embodiments of the invention when read in conjunction with the accompanying drawings in which:

DETAILED DESCRIPTION OF THE INVENTION

Figure 1:
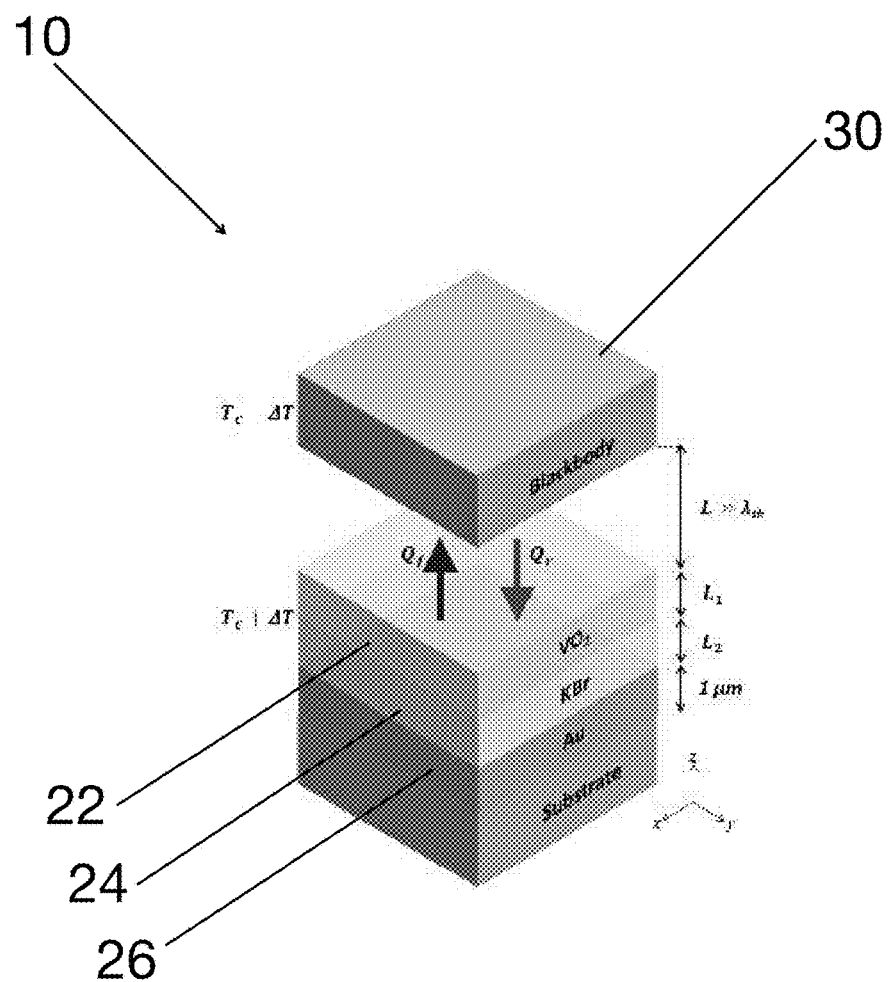
FIG. 1 is a schematic view of a far-field thermal diode.

Certain exemplary embodiments will now be described to provide an overall understanding of the principles of the structure, function, manufacture, and use of the device and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present disclosure. Further, in the present disclosure, like-numbered components of the embodiments generally have similar features, and thus within a particular embodiment each feature of each like-numbered component is not necessarily fully elaborated upon. Additionally, to the extent that directional terms like top, bottom, up, or down are used, they are not intended to limit the systems, devices, and methods disclosed herein. A person skilled in the art will recognize that these terms are merely relative to the system and device being discussed and are not universal.

The instant invention uses an exemplary far-field radiative thermal rectification device 10 that uses a phase change material to achieve a high degree of asymmetry in radiative heat transfer to create a thermal diode. A thermal diode is analogous to an electronic diode which is phonons-conduction based or radiation based. The instant device has a multilayer structure 20 on one side and a blackbody 30 on other side. The multilayer structure 20 consists of transparent film of KBr 24 sandwiched between a film of $VO_2$ 22 and a reflecting layer of gold 26. While the thin film of $VO_2$ 22 is in its insulating phase, the structure 20 can be highly reflective due to the two transparent layers 22, 24 on highly reflective gold 26. When the thin film of $VO_2$ 22 is in the metallic phase, a Fabry-Perot type of resonance occurs and the tri-layer structure 20 acts like a wide-angle antireflection coating achieved by destructive interference of partially reflected waves making it highly absorptive for majority of spectral range of thermal radiation. The instant device 10 can form the active part of configuration that acts like a far-field radiative thermal diode. Thermal rectification greater than 11 is obtained for a temperature bias of 20 K, which is the highest rectification ever predicted for far-field radiative diode configurations. Applications of the instant device can include thermal transistors, amplifiers, thermal memory devices, logic gates, switches, thermostats, thermal management, and dynamic radiative cooling systems.

In a first exemplary embodiment, a thermal diode having a first passive structure 30 and a second multilayer structure 20 is illustrated in FIG. 1. As illustrated, the active component 20 of the thermal diode 10 includes a tri-layer structure consisting of $VO_2$ 22, potassium bromide (KBr) 24 and gold thin films 26 on a substrate 28. The thicknesses of $VO_2$ and KBr layers can be tuned to maximize rectification. The thickness of gold layer is fixed at 1 μm to block radiation from the substrate. For a given temperature bias, maximum (far-field) radiative heat transfer would be possible when both sides 20, 30 are blackbodies, while minimum heat transfer would take place when at least one side 20 is a highly reflective mirror. The instant thermal diode is able to transition from maximum to minimum heat transfer. For example, the active component 20 can exhibit a transition from blackbody to reflective surface upon the reversal of a temperature bias which induces the phase change. As such, the passive component 30 is chosen to be a blackbody, such as for example asbestos, a variety of polymers, and ceramics, such as SiC. Any material other than a blackbody would not yield maximum rectification. The passive structure 1 30 and active structure 2 20 are at temperature $T_1=T_C+\Delta T$ and $T_2=T_C-\Delta T$, respectively. The mean temperature, i.e. the temperature around which the device operates, is chosen to be the phase transition temperature of $VO_2$($T_C$=341 K). When $T_1>T_2$ (referred to as forward bias), the $VO_2$ layer 22 is in its metallic phase; and when $T_1<T_2$ (referred to as reverse bias), the $VO_2$ layer 22 becomes insulating with its optical axis aligned along the vertical direction, i.e., z-axis.

Figure 6:
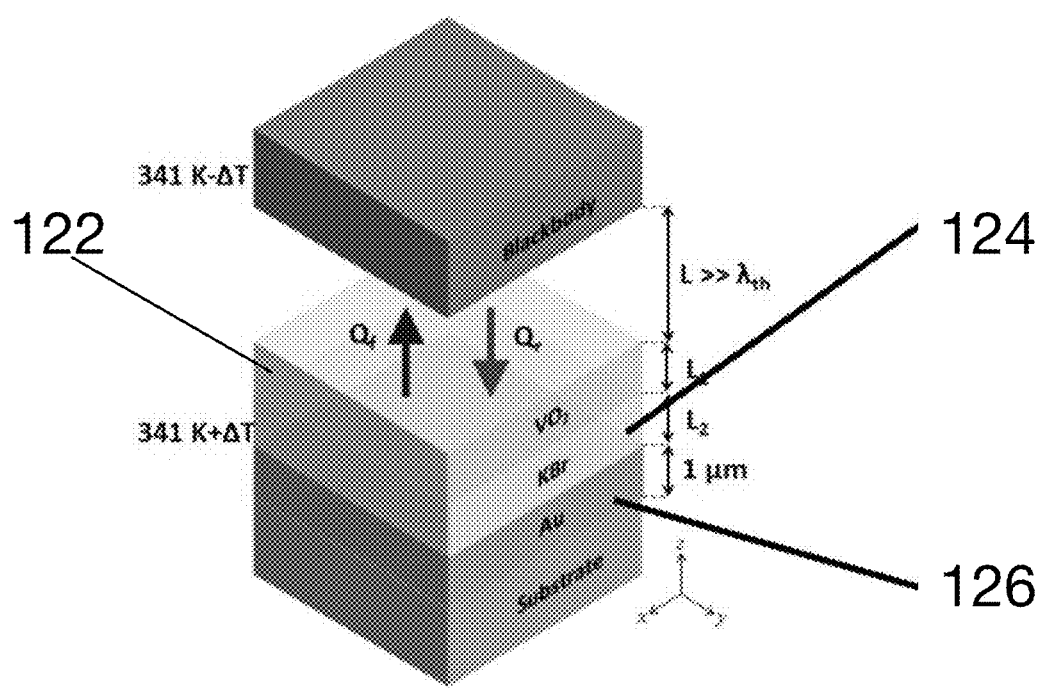
FIG. 6 is a schematic view of an alternative exemplary embodiment.

In an alternative embodiment, as shown in FIG. 6, some alternative materials for the Gold (Au) layer 126 and the Potassium Bromide (KBr) 124 layer are shown. For example, the alternative KBr layer 124 can be any of the following: $BaF_2$, $GdF_3$, $BiF_3$, ZnSe, ZnS, Si, GaAs, or Ge. Moreover, the gold thin film layer 126 can be any of the following: Ag, Al, Pt—Rd, or Cu. Further, AIST (an alloy of silver, indium, antimony, and tellurium) is an alternative material to the $VO_2$ material layer 122. While the phase change of AIST occurs through a different mechanism, by using an electric field, it behaves similarly to $VO_2$ in the instant thermal diode. In a further alternative embodiment, $La_{0.7}Ca_{0.15}Sr_{0.15}MnO_3$ (LCSMO) (T_C=~301 K) can be used in place of the $VO_2$ layer 122.

In use, the phase transition of the $VO_2$ layer 22 is not abrupt and a complete insulator-metal transition does not occur until 350 K. The rectification ratio depends on temperature bias as the temperature dependence of radiative heat transfer is essentially nonlinear. The rectification values are calculated at a minimal temperature bias of 20 K i.e., $\Delta T=\pm 10$ K. Although transition of $VO_2$ exhibits a thermal hysteresis of about 8 K, the phase transition is reversible.

As discussed herein, the multilayer structure 20 can be designed to attain high absorbance or reflectance based on its dimensions and material properties. Multilayer structures with constituent thicknesses much smaller than the incident wavelength of light have been studied before. However, the instant device with a $VO_2$ based multilayer structure 20, can show a dramatic change in the optical property of $VO_2$ upon phase-change facilitates an extensive variation in the surface reflectivity.

The device 10 as shown in FIG. 1 has variable dimensions of $VO_2$ ($L_1$) layer 22 and the KBr ($L_2$) layer 24. Default values of population size (50), fitness scaling (rank), crossover fraction (0.8), stopping criteria (100 generations) were selected in the optimization process. No tuning of optimization parameters was required as number of variables was only two. The lower and upper bounds on both $L_1$ and $L_2$ were in the range of approximately 25 nm and 2 μm, respectively. In one exemplary embodiment, the dimensions can be $L_1$=25 nm and $L_2$=880 nm.

Figure 2:
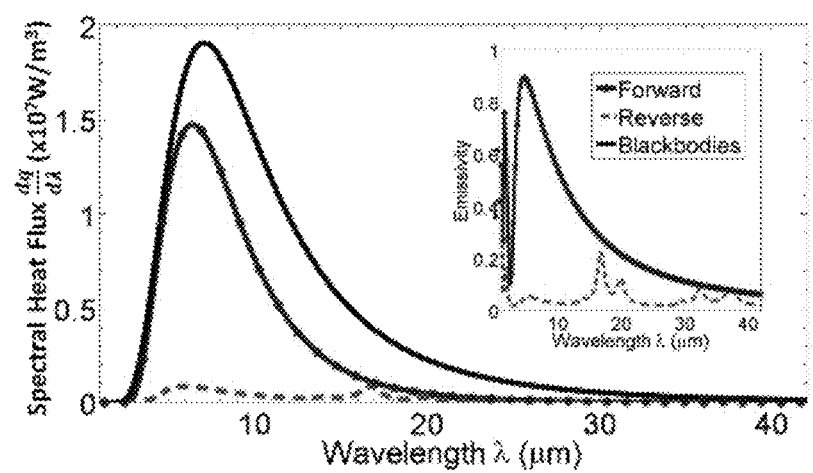
FIG. 2 is a graph illustrating spectral heat flux across the optimized thermal diode in forward and reverse bias scenarios.

FIG. 2 shows spectral heat flux (dq/dλ) of the instant thermal diode in forward and reverse direction with temperature bias 20 K (ΔT=10 K) having dimensions of $L_1$=25 nm and $L_2$=880 mn. The forward heat flux can be significantly higher than reverse flux as is shown in FIG. 2. A comparison is shown for heat flux across blackbodies at temperatures 331 K and 351 K, respectively. The inset in FIG. 2 displays angle-averaged emissivity of the active component in both scenarios. When the $VO_2$ layer 22 is metallic, the structure on the active component 20 has high emissivity near the thermal wavelength ($\lambda_{th}$=1.27ℏc/$k_B$T=8.5 μm for 341 K). As a significant portion of blackbody radiation falls within this range, this gives rise to a high heat flux in forward bias.

Figure 3:
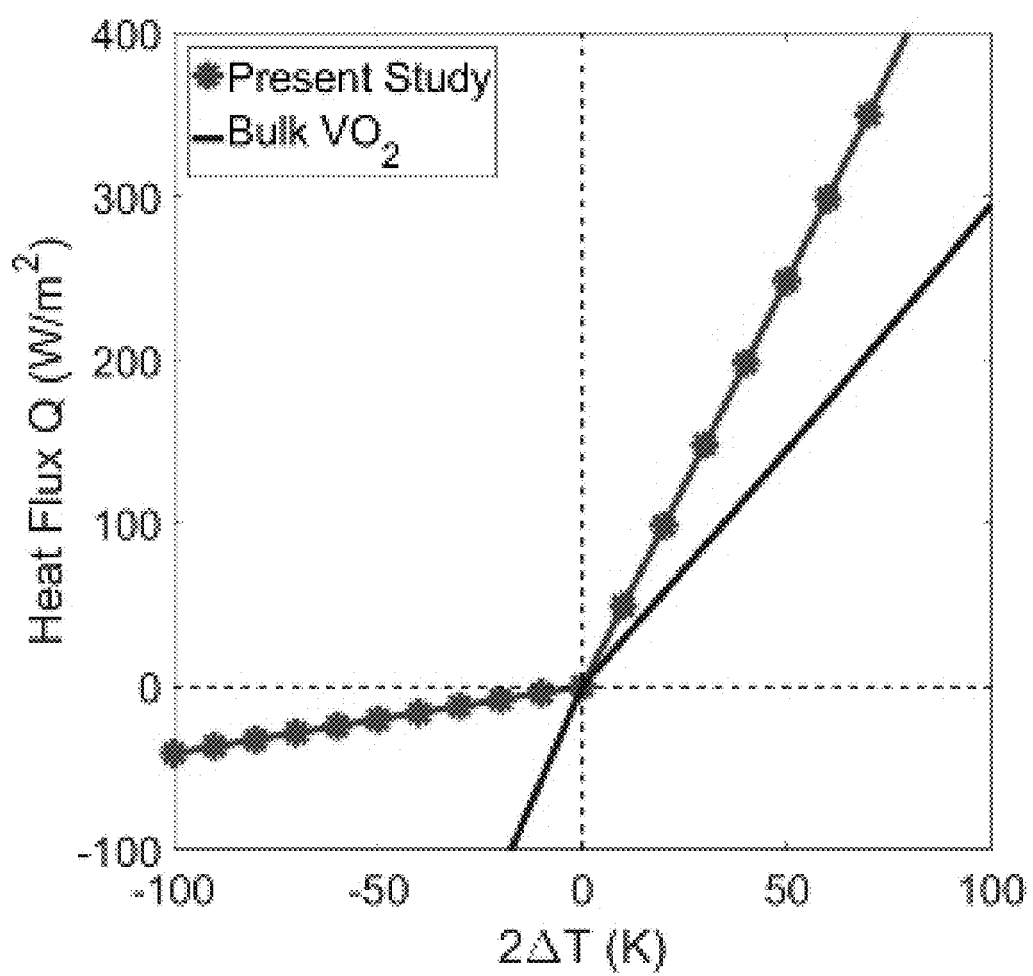
FIG. 3 illustrates heat flux plotted against temperature difference for thermal diode with bulk $VO_2$ and present structure.
Figure 4:
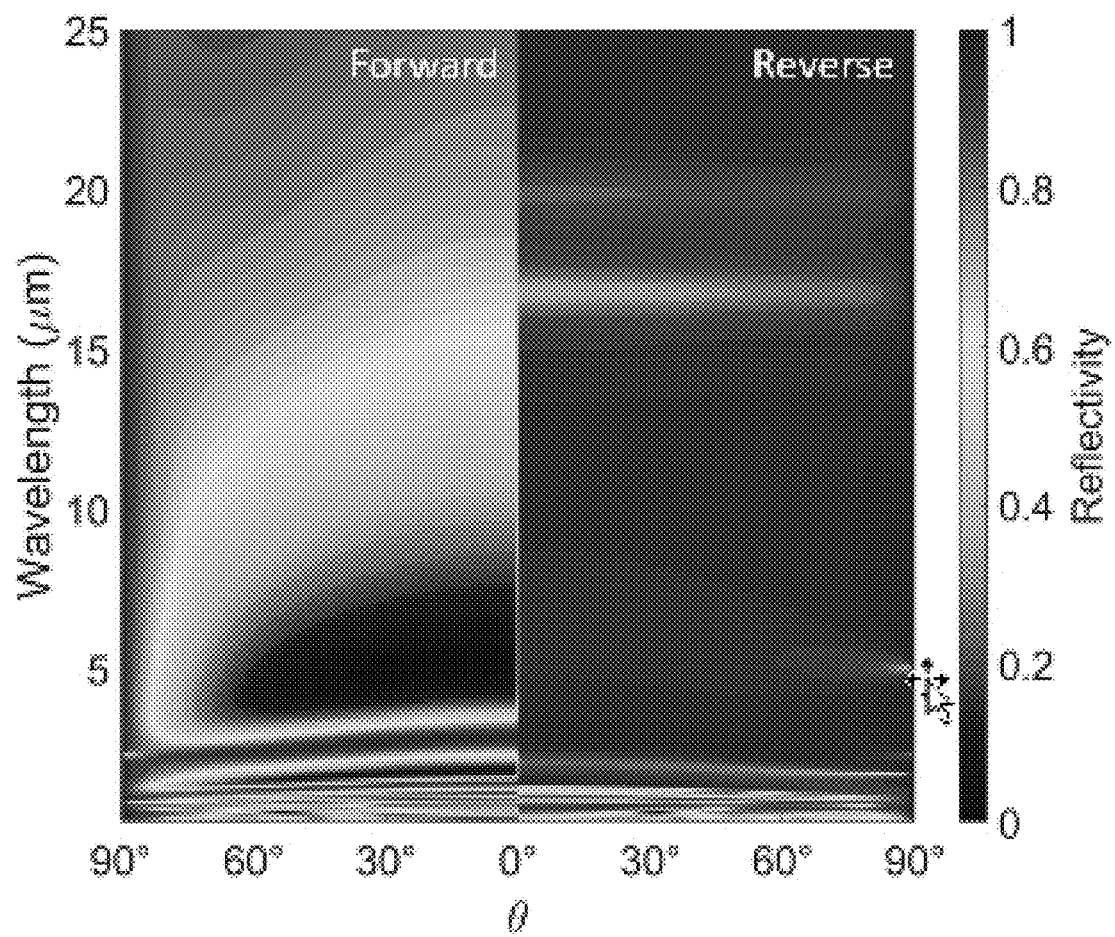
FIG. 4 illustrates angle dependent reflectivity of the active component of thermal diode plotted against wavelength and angle of incidence under forward and reverse bias.

However, when the $VO_2$ layer 22 is insulating, the structure has very low emissivity in the broad spectrum. The tri-layer structure 20 behaves like a highly reflecting mirror resulting in very low heat flux. Consequently, high contrast in heat flow is achieved leading to a high rectification ratio of 11.3 (η=0.918). In order to highlight the diode-like characteristics, heat flux across the device 10 has been plotted against temperature difference in FIG. 3. For comparison, simple case of bulk $VO_2$ is also shown. The bulk $VO_2$ has a rectification coefficient of η=0.49. Note that, effect of thermal hystersis is not considered here for simplicity. Angle dependent spectral reflectivity of the active component of the thermal diode is plotted in FIG. 4 for the forward and reverse bias cases. As shown, when $VO_2$ layer is metallic, the tri-layer structure acts like a wide-angle anti-reflection coating for wavelengths between 4 μm to 10 μm. The dark spot in FIG. 4 corresponds to the Fabry-Perot type of resonance that occurs around $\lambda=4n_{KBr}(\lambda)L_2$=5.3 μm. High absorption/emission in this wavelength region favors radiative heat transfer as thermal wavelength falls within this range. In reverse bias, the structure is highly reflective in a broad range of wavelengths giving rise to a very low absorption. Note that for thermal wavelength of 8.5 μm, Fabry-Perot resonance occurs (for metallic $VO_2$) when thickness of KBr layer is $L_2=\lambda_{th}/4n_{KBr}(\lambda_{th})$=1.4 μm. This configuration however, would not necessarily achieve maximum rectification as the structure may not be purely reflecting when the $VO_2$ layer 22 is in its insulating phase.

Figure 3A:
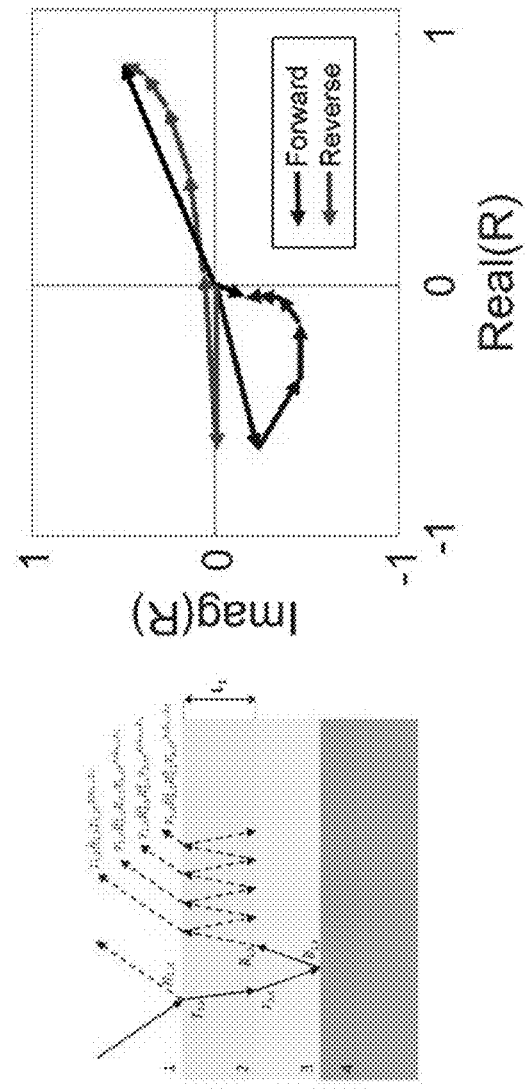
FIG. 3A illustrates an electromagnetic wave as it travels through the media.

Contrasting reflective properties of the structure are due to constructive and destructive interferences of electromagnetic waves generated by partial reflections at the interfaces. FIG. 3A shows an electromagnetic wave as it travels through the media. The wave is partially reflected at each interface leading to multiple reflections from each layer. This causes interference of electromagnetic waves due to each partial reflection. Effective reflection coefficient of the structure is the phasor sum of these reflection coefficients due to (an infinite number of) individual reflections. When the $VO_2$ layer 22 is metallic, phasor sum of partial reflections results in destructive interference in the wavelength range of 4 μm to 10 μm. As a result, the structure is highly absorptive in the range. When the $VO_2$ layer 22 is insulating, individual reflections add up to a large value making the structure highly reflective for a broad range of the spectrum.

Figure 5:
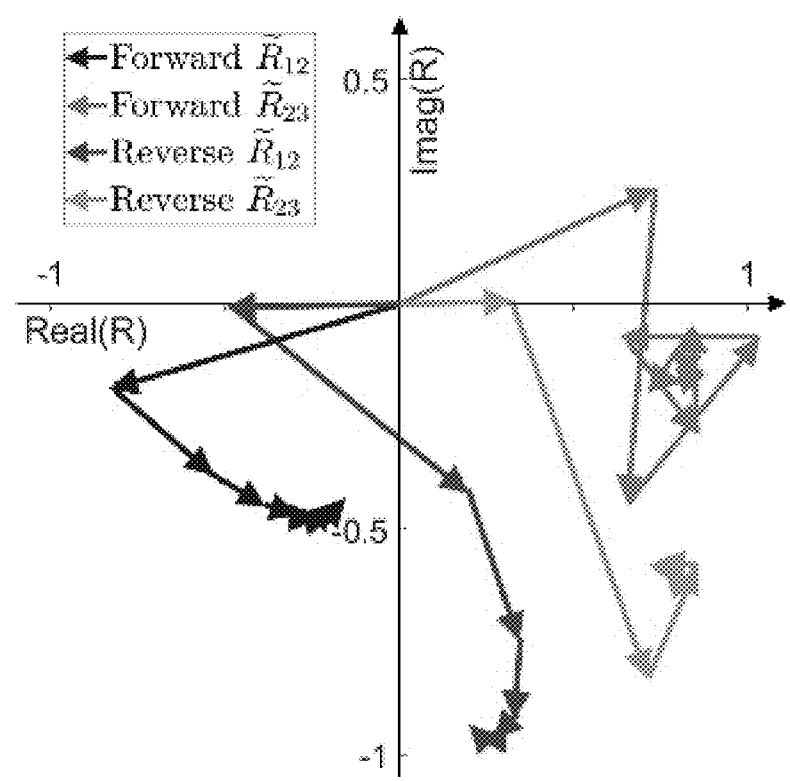
FIG. 5 Illustrates effective reflection coefficient at the air-$VO_2$ interface ($\tilde{R}_{1,2}$) and $VO_2$—KBr interface ($\tilde{R}_{2,3}$)

FIG. 5 shows phasor diagram of partial reflections at the air-$VO_2$ interface and the $VO_2$—KBr interface for TE polarized incident ray of wavelength $\lambda_{th}$=8.5 μm and angle of incidence 10°. $\tilde{R}_{1,2}$ is the effective reflection coefficient at the air-$VO_2$ interface and $\tilde{R}_{2,3}$ is the effective reflection coefficient at $VO_2$—KBr interface due to multiple reflections within the KBr layer. They can be expressed as geometric series whose terms are relative amplitudes of partial waves due to first, second and third reflection and so on. For both metallic, as well as insulating $VO_2$ phases, the magnitude of $\tilde{R}_{2,3}$, $|\tilde{R}_{2,3}|$, is large. However, when the $VO_2$ layer 22 is in metallic phase, each partial reflection results in a phase-shift such that partial waves add up destructively leading to a small value of $|\tilde{R}_{1,2}|$ and low reflectivity, especially in the wavelength range centered around thermal wavelength. On the other hand, in reverse bias (insulating $VO_2$) phasors add constructively, giving rise to highly reflective surface properties for a broad range of wavelengths. A similar phenomenon can be observed for TM polarization as well. As the KBr layer 24 is transparent and has a negligible extinction coefficient for most of infrared region, much of the absorption takes place within the $VO_2$ layer 22. The transparent layer of KBr 24 can mainly influence the reflective properties by altering the phase of the light propagating through the media. Potentially, any other material transparent to infrared light such as magnesium fluoride or intrinsic silicon can be used. However, optimal dimensions of such an alternative device might be different.

It can therefore be seen that the exemplary embodiments provide a unique and novel high-contrast thermal diode concept that uses a phase change material to achieve a high degree of asymmetry in radiative heat transfer.

While there is shown and described herein certain specific structures embodying various embodiments of the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A high-contrast thermal diode, comprising
   a passive component; and
   an active component comprising,
      a substrate,
      a first layer disposed above the substrate having a thickness of 1 μm;
      a second opaque layer having a thickness in the range of approximately 25 nm to 2 μm;
      a third layer comprising a phase change material having a thickness in the range of approximately 25 nm to 2 μm.

2. The thermal diode of claim 1, wherein the phase change material of the third layer is one of $VO_2$, $La_{0.7}Ca_{0.15}Sr_{0.15}MnO_3$ (LCSMO), and AIST.

3. The thermal diode of claim 2, where in the phase change material of the third layer is $VO_2$.

4. The thermal diode of claim 1, wherein the second opaque layer is one of KBr, $BaF_2$, $GdF_3$, $BiF_3$, ZnSe, ZnS, Si, GaAs, and Ge.

5. The thermal diode of claim 4, wherein the second opaque layer is KBr.

6. The thermal diode of claim 1, wherein the first layer is one of Au, Ag, Al, Pt-Rd, and Cu.

7. The thermal diode of claim 6, wherein the first layer is Au.

8. The thermal diode of claim 1, wherein the second opaque layer has a thickness of 880 nm.

9. The thermal diode of claim 8, wherein the third layer has a thickness of 25 nm.

10. The thermal diode of claim 1, wherein the third layer is configured to be in a metallic phase where the active component has a high emissivity.

11. The thermal diode of claim 10, wherein when the third layer configured to be in an insulating phase where the active component has a low emissivity in the broad spectrum.

12. The thermal diode of claim 1, wherein the diode has a rectification ratio of approximately 11.3.

13. A far-field radiative thermal rectification device comprising,
    a passive component; and
    a multilayer structure disposed a distance from the passive component, the multilayer structure comprising,
        a transparent thin film of KBr;
        a thin film of $VO_2$, and
        a layer of gold,
    wherein the thin film of $VO_2$ is disposed between the thin film of KBr and the layer of gold.

14. The device of claim 13, wherein the $VO_2$ thin film is configured to have at least an insulating phase and a metallic phase.

15. The device of claim 14, wherein when the $VO_2$ thin film is in the insulating phase, the multilayer structure is highly reflective.

16. The device of claim 14, wherein when $VO_2$ is in the metallic phase, a Fabry-Perot type of resonance occurs and the multilayer structure acts like a wide-angle antireflection coating having a high absorptive for a majority of spectral range of thermal radiation.

17. The device of claim 13, wherein the device is configured as a far-field radiative thermal diode.

18. The device of claim 13, wherein the device is configured to have a thermal rectification greater than 11 at a temperature bias of about 20 K.

* * * * *